(12) United States Patent
Abou-Khalil et al.

(10) Patent No.: US 7,881,028 B2
(45) Date of Patent: Feb. 1, 2011

(54) E-FUSE USED TO DISABLE A TRIGGERING NETWORK

(75) Inventors: Michel J. Abou-Khalil, Essex Junction, VT (US); Robert J. Gauthier, Jr., Hinesburg, VT (US); Tom C. Lee, Essex Junction, VT (US); Junjun Li, Williston, VT (US); Souvick Mitra, Burlington, VT (US); Christopher S. Putnam, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 12/041,962

(22) Filed: Mar. 4, 2008

(65) Prior Publication Data

US 2009/0225481 A1    Sep. 10, 2009

(51) Int. Cl.
*H02H 9/00* (2006.01)
(52) U.S. Cl. ........................................... 361/56
(58) Field of Classification Search .................. 361/56
See application file for complete search history.

(56) References Cited

U.S. PATENT DOCUMENTS

| | | | |
|---|---|---|---|
| 4,875,130 A | 10/1989 | Huard | |
| 5,124,587 A * | 6/1992 | Pribyl | 326/38 |
| 5,341,267 A | 8/1994 | Whitten et al. | |
| 5,559,659 A * | 9/1996 | Strauss | 361/56 |
| 6,327,125 B1 | 12/2001 | Colclaser et al. | |
| 6,760,209 B1 | 7/2004 | Sharpe-Geisler | |
| 6,919,602 B2 * | 7/2005 | Lin et al. | 257/360 |
| 7,085,113 B2 * | 8/2006 | Gauthier et al. | 361/56 |
| 7,321,522 B2 * | 1/2008 | Dixon et al. | 365/225.7 |
| 2006/0028777 A1* | 2/2006 | Chung et al. | 361/56 |
| 2007/0076338 A1* | 4/2007 | Traynor et al. | 361/56 |
| 2007/0146950 A1* | 6/2007 | Frankhauser et al. | 361/91.1 |
| 2007/0247772 A1* | 10/2007 | Keppens et al. | 361/56 |
| 2007/0285854 A1* | 12/2007 | Rodgers et al. | 361/56 |

FOREIGN PATENT DOCUMENTS

JP     402128461 A1 *   5/1990

* cited by examiner

*Primary Examiner*—Jared J Fureman
*Assistant Examiner*—Angela Brooks
(74) *Attorney, Agent, or Firm*—David Cain; Roberts Mlotkowski Safran & Cole, P.C.

(57) ABSTRACT

A device and/or circuit having an e-fuse is provided to disable a triggering network, and more specifically, an e-fuse is used to disable an electrostatic discharge (ESD) RC triggering network after device installation. The device and/or circuit includes a triggering network electrically coupled to an electrostatic discharge (ESD) protection device. An e-fuse is electrically coupled with the triggering network and configured to render the ESD protection device insensitive to a triggering signal after blowing the e-fuse.

15 Claims, 7 Drawing Sheets

US 7,881,028 B2

E-FUSE USED TO DISABLE A TRIGGERING NETWORK

FIELD OF THE INVENTION

The present invention generally relates to an e-fuse used to disable a triggering network, and more specifically, to an e-fuse used to disable an Electro-Static Discharge (ESD) RC triggering network.

BACKGROUND OF THE INVENTION

In conventional processor designs, protecting devices from electrostatic discharge (ESD) voltage spikes is a significant problem. For example, providing ESD protection for I/O circuits while maintaining the ability of the product to function as intended in normal operation is a challenge. The problem is particularly pronounced when the devices are being assembled into a larger package. This is because the device (chip) may be exposed to ESD events in a variety of places, but particularly during sorting, packaging, transporting, and final placement on a product circuit board. Therefore, to protect the device, ESD protection is installed for sensitive parts of the device, which limits the voltage at the sensitive area to an acceptable level for an ESD event of a given magnitude.

For instance, one method of ESD protection could employ diodes as shown in FIG. 1. A diode is either forward or reverse biased. If a diode is forward biased, it conducts; whereas, if the diode is reverse biased, it does not conduct. When a diode is forward biased, the voltage on the diode's cathode is less than the voltage on the diode's anode. The difference in voltage required to forward bias a diode is the activation voltage, which is the magnitude of the minimum voltage difference between the anode and the cathode required to forward bias a diode (where the voltage applied to the cathode is lower than the voltage applied to the anode). Since the activation voltage of a diode is usually around 0.6 volts, to forward bias a diode, the voltage on the anode must be at least 0.6 volts higher than the voltage on the cathode.

Diodes could be coupled to an input/output (I/O) pad. In such an example, the anode of a first diode is tied to the cathode of a second. A connection is made between the anode of the first diode and the I/O pad. The anode of the second diode is tied to ground, and the cathode of the first diode is tied to the system high voltage (Vdd). When the voltage difference between the I/O pad and ground exceeds the activation voltage of the second diode, the second diode becomes forward biased and creates a conducting path from ground to the I/O pad.

Connecting the I/O pad to ground through the second diode protects the input coupled to the I/O pad by preventing the magnitude of the voltage difference between ground and the I/O pad from exceeding the activation voltage of the second diode. When the voltage difference between the I/O pad and Vdd exceeds the activation voltage of the first diode, the first diode becomes forward biased and creates a conducting path from Vdd to the I/O pad. Connecting the I/O pad to Vdd through the first diode protects the input coupled to the I/O pad by preventing the magnitude of the voltage difference between Vdd and the I/O pad from exceeding the activation voltage of the first diode.

However, as the processing speeds of devices have increased, the frequency of voltage oscillations on the I/O pad has also increased. Also, as the clock frequency of a device approaches 2 GigaHertz, the capacitance effect of the ESD protection diodes becomes problematic. For example, coupling the first diode to Vdd and the second to ground creates capacitance when the diodes are reverse biased. Under ordinary circumstances, diodes laid out in series with one another can mitigate the capacitance, but placing the diodes in series does not eliminate the capacitance because the capacitance of the diodes varies non-linearly. Also, placing them in series can have a detrimental affect to the ESD robustness of the design since the I/O pad voltage will climb to a higher level before all of the diodes in the series reach their activation energy. Likewise, laying out diodes in parallel merely increases the capacitance effect. Ultimately, the excess capacitance created by the diodes limits the effective signaling speed of the I/O pad.

To compensate for ESD events, it is also known to use e-fuses directly in the path of an ESD device, where resistance values are on the order of <500Ω pre-blow and >5 kΩ post-blow. However, the large pre-blow series resistance makes their use in the discharge path problematic since the resistance in this path must be kept very low.

Accordingly, there exists a need in the art to overcome the deficiencies and limitations described hereinabove.

SUMMARY OF THE INVENTION

In a first aspect of the invention, a circuit comprises a triggering network electrically coupled to an electrostatic discharge (ESD) protection device. An e-fuse is electrically coupled with the triggering network and configured to render the ESD protection device insensitive to a triggering signal after blowing the e-fuse.

In an additional aspect of the invention, a device comprises a triggering network electrically coupled to an e-fuse and an ESD protection device. The triggering network is configured to permit a relative high voltage input to the ESD protection device during an ESD event and, post blowing of the e-fuse, the e-fuse is configured to decouple the triggering network such that a relative low voltage input is always provided to the ESD protection device effectively resulting in the ESD protection device being insensitive to a triggering signal.

In a further aspect of the invention, a structure comprises a method of rendering an ESD protection device being insensitive to a triggering signal comprises blowing an e-fuse electrically coupled to an RC triggering network after installation of a device.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention relates to an e-fuse used to disable a triggering network, and more specifically, to an e-fuse used to disable an electrostatic discharge (ESD) RC triggering network after device installation. By implementing the invention, it is now possible to prevent the network from triggering the ESD protection during normal operation. Also, in accordance with the invention as the e-fuse is blown after the device (also referred to generally as a "chip") is permanently placed in an ESD safe environment, such as on a circuit board deep within a system that does not have I/Os directly coupled to the outside world, it is now possible to ensure that the chip remains protected from ESD event, while also ensuring that device performance is not affected by the protection circuitry triggering on during normal operations.

More specifically, ideally during normal operation no RC triggering should occur. However, in certain situations, a signal transition during normal operation can be "misinterpreted" leading to a mis-trigger of the ESD protection device (e.g., the "big" NFET in the RC triggered Power Clamp). For example, mis-trigger can occur when a high frequency is provided to signal pads or by fast ramping low capacitance power supplies. Mis-trigger can also be detrimental to device performance, e.g., resulting in excessive leakage of the power rail, especially if the power clamp has a positive feedback design. Thus, by implementing the present invention, once the chip is permanently mounted on a product circuit board, and if either the board is configured such that the chip does not have any direct I/O connections to the "outside world," or if ESD protection is provided on the board to protect the chip's I/O, the RC triggering network can be disabled thus eliminating the above problems (which was not previously contemplated or possible in conventional system). It is advantageous to disable the RC triggering network since it is unlikely that the chip itself would have any further potential exposure to ESD events, after installation.

It is noted that the examples focus on RC triggering NFET power clamps. For example, the techniques described herein are implemented with NFET power clamps as well as NFETs with body voltages being adjusted by RC triggering protecting I/Os. The techniques described herein, though, can be applied to any type of RC triggering methodology employed for ESD protection.

BRIEF DESCRIPTION OF THE SEVERAL VIEWS OF THE DRAWINGS

Figure 1:
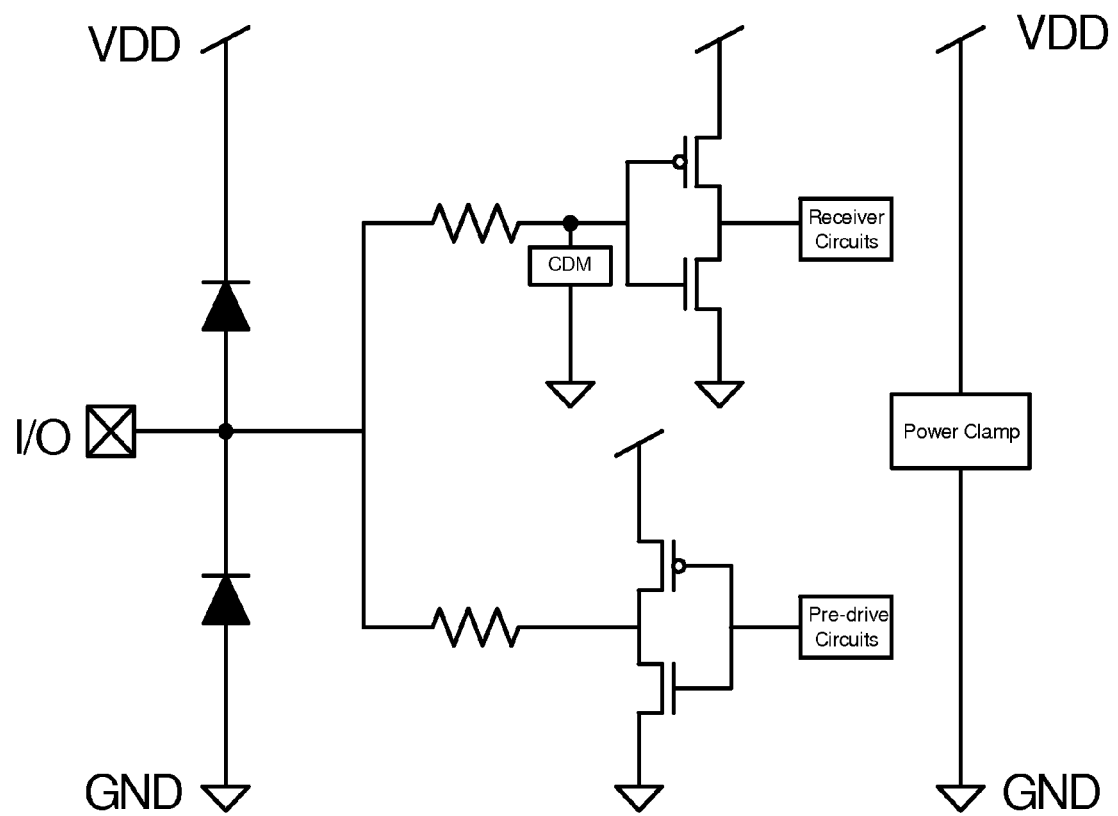
FIG. 1 shows a schematic illustration of an ESD protection scheme utilizing diodes and an RC triggered ESD Power Clamp.
Figure 2:
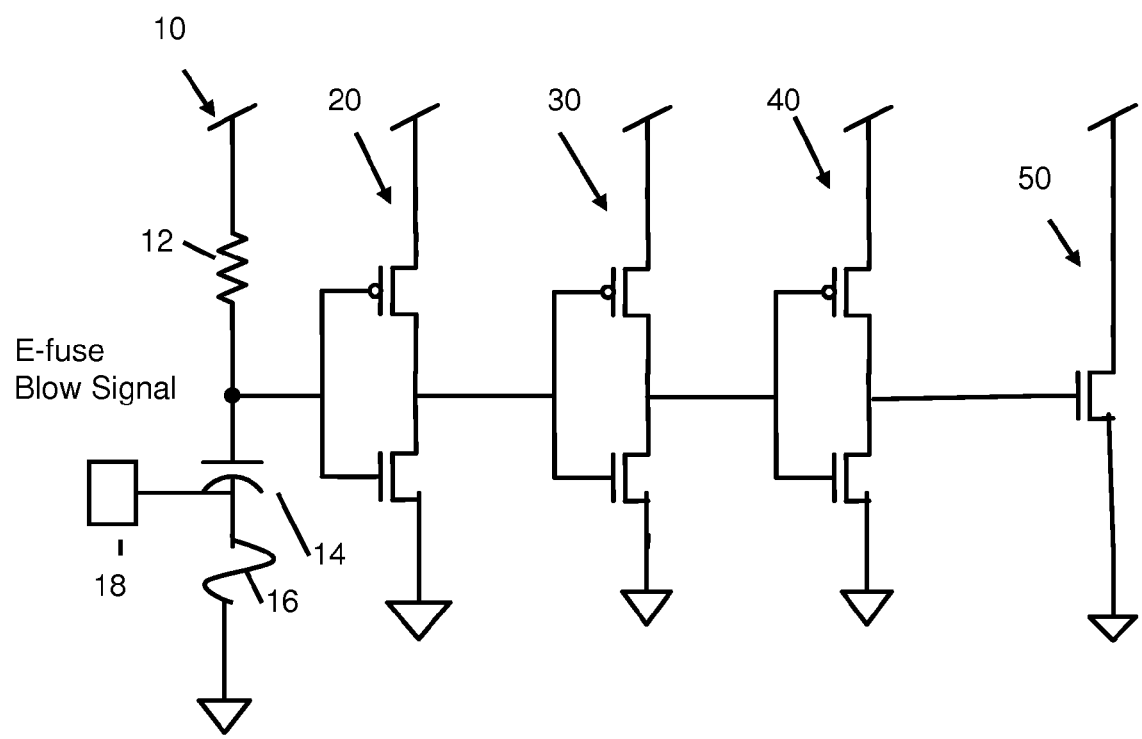
FIG. 2 shows an RC triggered ESD Power Clamp with an e-fuse in accordance with a first aspect of the invention.

FIG. 2 shows an RC triggering ESD Power Clamp with an e-fuse in accordance with a first aspect of the invention. In particular, the structure of FIG. 2 shows an RC triggering network 10 electrically coupled in series with three inverters 20, 30, 40 (or any odd number of inverters). In this implementation, from Vdd to ground, the RC triggering network 10 includes a resistor 12 electrically coupled in series with a capacitor 14 and an e-fuse 16. In one embodiment, the e-fuse 16 is made of polysilicon.

In embodiments, the resistor 12 has a large resistance, e.g., about R=50 kΩ. In further embodiments, the capacitor has a capacitance of about 20 pF. It should be understood by those of skill in the art that the resistance and capacitance values may vary depending on the particular application and that the above values should not be considered a limiting feature of the present invention. Also, regardless of the resistance of the resistor 12, the relative magnitude of resistance of the e-fuse 16 is sufficiently smaller than the resistor 12 in the pre-blown state, thereby ensuring that the e-fuse 16 does not interfere with the normal operations of the RC triggering network during an ESD event. In the post blown state, though, the relative magnitude of resistance of the e-fuse 16 is greater than that of the resistor 12.

An e-fuse blow signal 18 is provided to blow the e-fuse 16, impeding the ability of the RC triggering network from transitioning to a low state after installation. An ESD protection device 50 (e.g., "big" NFET) is electrically coupled to the output of the inverter 40. The ESD protection device 50 has a large width capable of handling a large amount of current with low on resistance.

In operation, during an ESD event, the voltage will quickly go from 0 volts to a high voltage (e.g., 1 or higher volts) for a certain duration. Initially this will effectively "short" the capacitor 14 resulting in a low voltage input to the inverter 20. In turn, the output of the inverter 20 will be a high voltage, which will be the input to the inverter 30. This results in a low voltage output of the inverter 30, which will be the input to the inverter 40. In turn, the output of the inverter 40 will be a high voltage, which is the input to the ESD protection device 50. As the voltage input to the ESD protection device 50 is a high voltage, the ESD protection device 50 will turn on and discharge the voltage from Vdd to ground. Accordingly, the ESD protection device 50 protect the device from the ESD event.

Once the device is installed in an ESD protected environment, the e-fuse 16 can be blown by the e-fuse blow signal 18. In one example, the e-fuse 16 may be blown with a low voltage of approximately 40 mV. By blowing the e-fuse 16, it is now possible to disable the ESD protection device 50. More specifically, blowing the e-fuse 16 will impede the RC triggering network 10 from transitioning to a low state. That is, by blowing the e-fuse 16, the voltage input to the inverter 20 will always be high, as the capacitor 14 is cutoff and the RC triggering network is disabled (and the input to the ESD protection device will be low).

In the above scenario, by blowing the e-fuse 16, the input of the inverter 20 will be a high voltage and the output of the inverter 20 will be a low voltage. In turn, the input to the inverter 30 will be a low voltage and the output of the inverter 30 will be a high voltage. This will result in the input to the inverter 40 being at a high voltage and the output of the inverter 40 being at a low voltage. The low output voltage will be the input to the ESD protection device 50. As the voltage input to the ESD protection 50 will now always be low, the ESD protection device 50 cannot be turned on, effectively disabling the ESD protection device 50. Thus, the e-fuse is configured to render the ESD protection device insensitive to a potentially triggering signal after blowing the e-fuse of the circuit.

Figure 3:
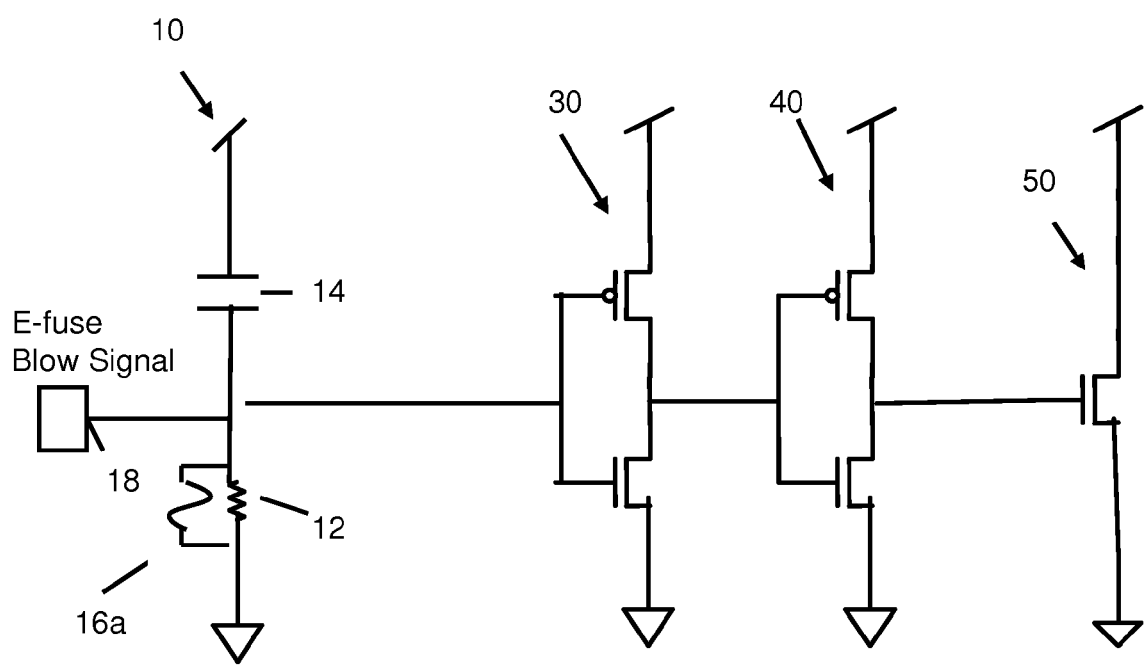
FIG. 3 shows an RC triggered ESD Power Clamp with an anti e-fuse in accordance with a second aspect of the invention.

FIG. 3 shows an RC triggered ESD Power Clamp with an anti e-fuse in accordance with a second aspect of the invention. In particular, the structure of FIG. 3 shows an RC triggering network 10 electrically coupled in series with two inverters 30, 40 (or any even number of inverters). In this implementation, from Vdd to ground, the RC triggering network 10 includes a capacitor 14 electrically coupled in series with a resistor 12. An anti e-fuse 16a is electrically coupled to the resistor 12, in parallel. In embodiments, the anti e-fuse 16a can be a MOS capacitor whose oxide is damaged during the fuse blow. Alternatively, the anti e-fuse 16a can be a FET with engineered snapback voltage that would short during fuse blow.

In embodiments, the resistor 12 has a large resistance, e.g., about R=50 k ohms. In further embodiments, the capacitor has a capacitance of about 20 pF. It should be understood by those of skill in the art that the resistance and capacitance values may vary depending on the particular application and that the above values should not be considered a limiting feature of the present invention. Also, the relative magnitude of resistance of the anti e-fuse 16a is greater than the resistor 12 in the pre-blown state, thereby ensuring that the anti e-fuse 16 does not interfere with the normal operations of the RC triggering network during an ESD event. In the post-blown state, though, the relative magnitude of resistance of the anti e-fuse 16a is less than the resistor 12.

An e-fuse blow signal 18 is provided to blow the anti e-fuse 16a after device installation. An ESD protection device 50 (e.g., "big" NFET) is electrically coupled to the output of the inverter 40. The ESD protection device 50 has a large width capable of handling a large amount of current with low on resistance.

In operation, during an ESD event, the voltage will quickly go from 0 volts to a high voltage (e.g., 1 or higher volts) for a certain duration. In this case, the input voltage to the inverter 30 is high and the output of the inverter 30 is low. In turn, the input voltage to the inverter 40 is low and the output of the inverter 40 is high. The high voltage output of the inverter 40 will be the input voltage to the ESD protection device 50. As the voltage input to the ESD protection device 50 is high, the ESD protection device 50 will turn on and discharge the voltage from Vdd to ground. Accordingly, the ESD protection device 50 protects the device from the ESD event.

Once the device is installed in an ESD protected environment, the anti e-fuse 16a can be blown by the e-fuse blow signal 18. By blowing the anti e-fuse 16a, it is now possible to disable the ESD device. More specifically, blowing the anti e-fuse 16a will impede the RC network 10 from transitioning to a high voltage state by shorting the resistor 12. That is, the voltage input to the inverter 30 will remain low, as the capacitor 14 will be charged and the resistor 12 will be effectively shorted.

In the above scenario, by blowing the e-fuse 16, the voltage input to the inverter 30 will be low and the output of the inverter 30 will be high. In turn, the input voltage to the inverter 40 will be high and the output of the inverter 40 will be low. The low voltage output will be the input to the ESD protection device 50. As the voltage input to the ESD protection 50 will now remain low, the ESD protection device 50 cannot be turned on, effectively disabling the ESD protection device 50. Thus, the anti e-fuse is configured to render the ESD protection device insensitive to a potentially triggering signal after blowing the e-fuse of the circuit.

Figure 4:
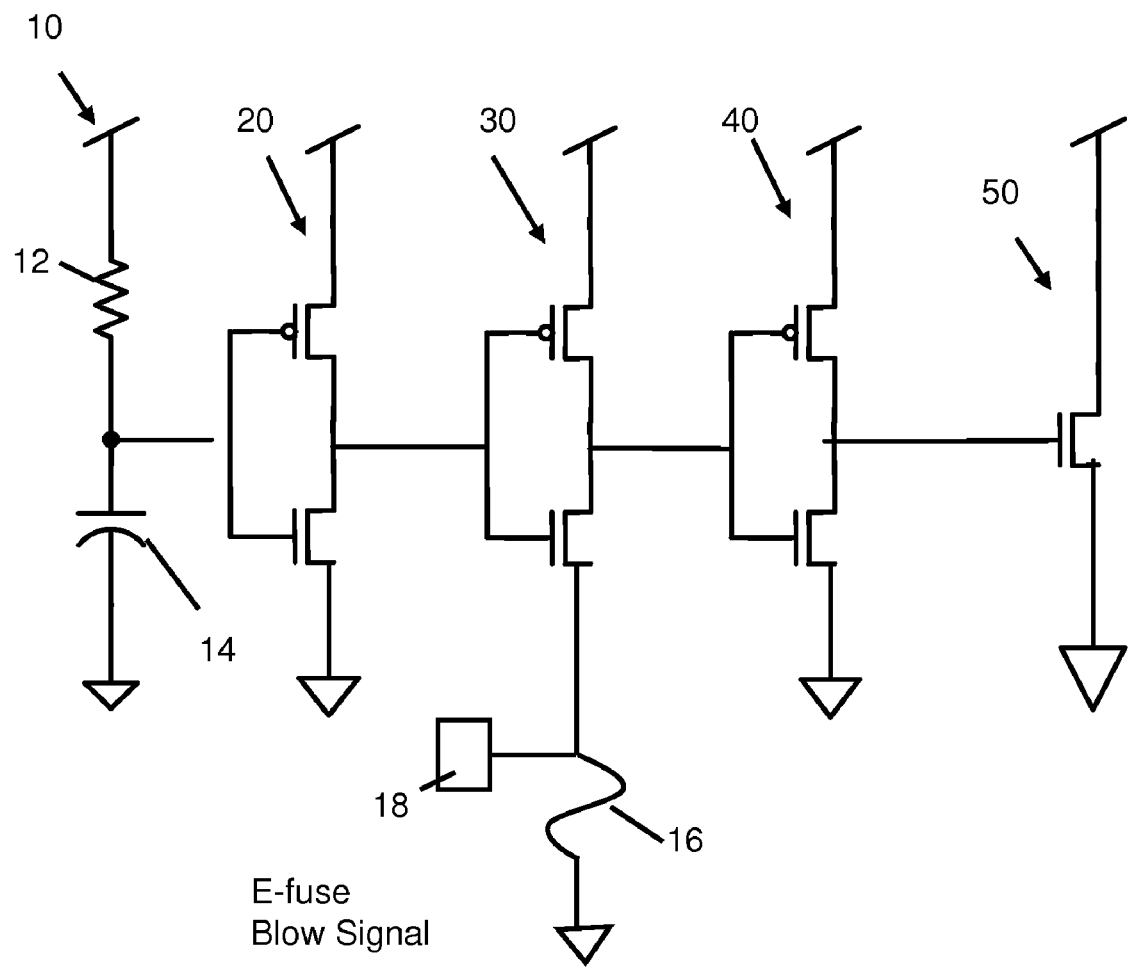
FIG. 4 shows an RC triggered ESD Power Clamp with an e-fuse in accordance with a third aspect of the invention.

FIG. 4 shows an RC triggered ESD Power Clamp with an e-fuse in accordance with a third aspect of the invention. In particular, the structure of FIG. 4 shows an RC triggering network 10 electrically coupled in series with three inverters 20, 30, 40 (or any odd number of inverters greater than three). In this implementation, from Vdd to ground, the RC triggering network 10 includes a resistor 12 in series with a capacitor 14. An e-fuse 16, leading to ground, is electrically coupled in series with the inverter 30 (or any even numbered inverter spaced away from either the RC triggering network 10 or the ESD protection device). In one embodiment, the e-fuse 16 is made of polysilicon.

In embodiments, the resistor 12 has a large resistance, e.g., about R=50 k ohms. In further embodiments, the capacitor has a capacitance of about 20 pF. It should be understood by those of skill in the art that the resistance and capacitance values may vary depending on the particular application and that the above values should not be considered a limiting feature of the present invention.

An e-fuse blow signal 18 is provided to blow the e-fuse 16 after installation. An ESD protection device 50 (e.g., "big" NFET) is electrically coupled to the output of the inverter 40. The ESD protection device 50 has a large width capable of handling a large amount of current with low on resistance.

In operation, during an ESD event, the voltage will quickly go from 0 volts to a high voltage (e.g., 1 or higher volts) for a certain duration. Initially, this will effectively "short" the capacitor 14 resulting in a low voltage input to the inverter 20 and a high voltage output of the inverter 20. In turn, the input to the inverter 30 will be a high voltage and the output of the inverter 30 will be a low voltage. In turn, the input to the inverter 40 will be a low voltage and the output of the inverter 40 will be a high voltage. This will result in a high input voltage to the ESD protection device 50. As the voltage input to the ESD protection device 50 is high, the ESD protection device 50 will turn on and discharge the voltage from Vdd to ground. Accordingly, the ESD protection device 50 protects the device from the ESD event.

Once the device is installed in an ESD protected environment, the e-fuse 16 can be blown by the e-fuse blow signal 18. In one example, the e-fuse 16 may be blown with a low voltage of approximately 40 mV. By blowing the e-fuse 16, it is now possible to disable the ESD device. More specifically, blowing the e-fuse 16 will cutoff the ground connection from the inverter 30, impeding the inverter string from outputting a high to the ESD protection device 50. That is, by blowing the e-fuse 16, the voltage output of the inverter 30 will remain low. And, as the voltage input to the ESD protection 50 will now always be low, the ESD protection device 50 cannot be turned on, effectively disabling the ESD protection device 50. Thus, the e-fuse is configured to render the ESD protection device insensitive to a potentially triggering signal after blowing the e-fuse of the circuit.

Figure 5:
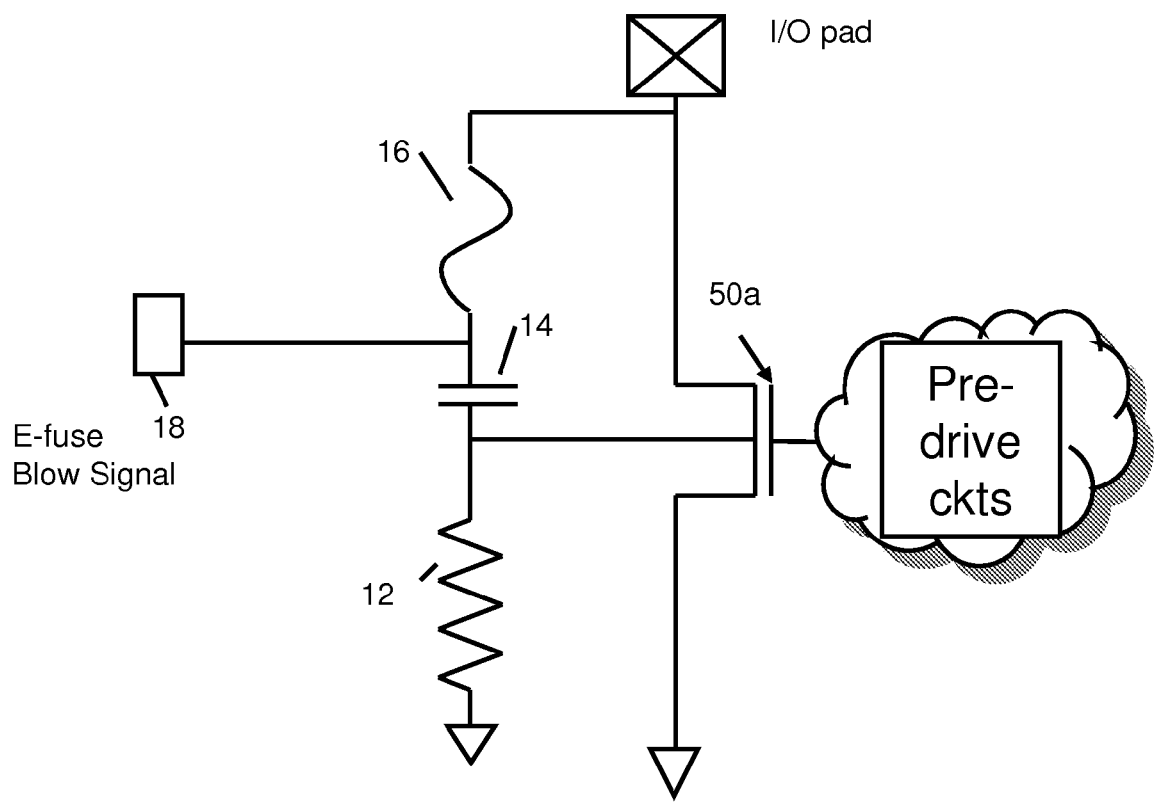
FIG. 5 shows an NFET with RC triggering adjusting the body voltage with an e-fuse in accordance with a fourth aspect of the invention.

FIG. 5 shows an NFET whose body voltage is adjusted through the use of an RC triggering circuit. An e-fuse is included in the RC triggering circuit in accordance with a fourth aspect of the invention. In the structure of FIG. 5, from I/O pad to ground, the RC triggering body (network) includes an e-fuse 16 electrically coupled in series with a capacitor 14 and a resistor 12. In one embodiment, the e-fuse 16 is made of polysilicon.

In embodiments, the resistor 12 has a large resistance, e.g., about R=50 k ohms. In further embodiments, the capacitor has a capacitance of about 20 pF. It should be understood by those of skill in the art that the resistance and capacitance values may vary depending on the particular application and that the above values should not be considered a limiting feature of the present invention. Again, it is noted that the relative magnitude of resistance of the e-fuse 16 is sufficiently smaller than the resistor 12 in the pre-blown state. In the post-blown state, though, the relative magnitude of resistance of the e-fuse 16 is greater than the resistor 12.

An e-fuse blow signal 18 is provided to blow the e-fuse 16 after device installation. An ESD protection device 50a is electrically coupled to the RC triggering network (body) and an I/O pad. The ESD protection device 50a could also serve as the output driver for the I/O pad and is designed consistent with techniques known to those skilled in the art to handle the current of the ESD event after it snaps back into bipolar conduction.

In operation, during an ESD event, the voltage will quickly go from 0 volts to a high voltage (e.g., 1 or higher volts) for a certain duration. This will effectively "short" the capacitor 14 resulting in the body voltage rising to the voltage of the I/O pad. This, in turn, will reduce the snap back voltage which is beneficial to the ESD performance of the ESD protection device 50a However, after the e-fuse 16 is blown, the I/O pad connection is cutoff from the RC triggering network, resulting in the body voltage remaining at a low voltage, i.e., 0 volts. In one example, the e-fuse 16 may be blown with a low voltage of approximately 40 mV. As the voltage input to the ESD protection device 50a will now always be low, the body of the ESD protection device 50a will no longer fluctuate but will remain at ground, which is advantageous for normal circuit operation. For this case the adjustment of the FET body resistance is "turned off" but the FET will still function like a FET. Thus, the e-fuse is configured to render the ESD protection device insensitive to a potentially triggering signal after blowing the e-fuse of the circuit.

Figure 6:
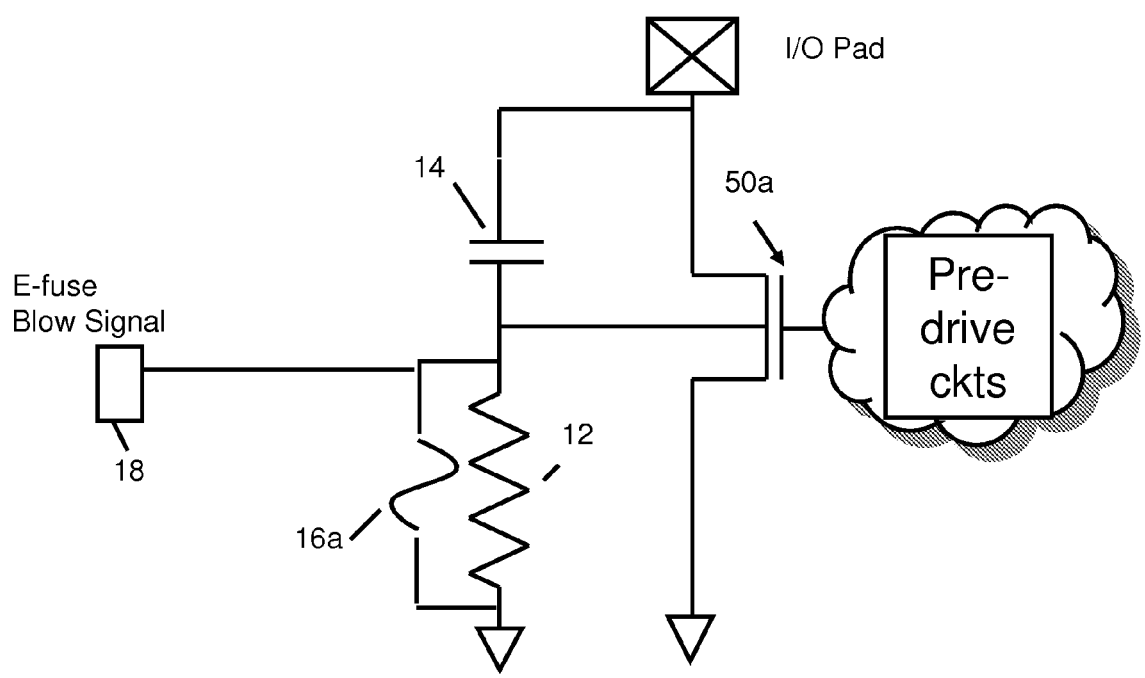
FIG. 6 shows an NFET with RC triggering adjusting the body voltage with an anti e-fuse in accordance with a fifth aspect of the invention.

FIG. 6 shows an NFET whose body voltage is adjusted through the use of an RC triggering circuit. An anti e-fuse 16a is included in the RC triggering circuit in accordance with a fifth aspect of the invention. In the structure of FIG. 6, from I/O pad to ground, the RC triggering body (network) includes a capacitor 14 and a resistor 12.

The anti e-fuse 16a is electrically coupled in parallel with the resistor 12. In one Embodiment, the anti e-fuse 16a is made of polysilicon.

In embodiments, the resistor 12 has a large resistance, e.g., about R=50 k ohms. In further embodiments, the capacitor has a capacitance of about 20 pF. It should be understood by those of skill in the art that the resistance and capacitance values may vary depending on the particular application and that the above values should not be considered a limiting feature of the present invention. Again, it is noted that the relative magnitude of resistance of the anti e-fuse 16a is sufficiently larger than the resistor 12 in the pre-blown state. In the post-blown state, though, the relative magnitude of resistance of the anti e-fuse 16a is smaller than the resistor 12.

An e-fuse blow signal 18 is provided to blow the anti e-fuse 16 after device installation. An ESD protection device 50a is electrically coupled to the RC triggering network (body) and an I/O pad. The ESD protection device 50a could also serve as the output driver for the I/O pad and is designed consistent with techniques known to those skilled in the art to handle the current of the ESD event after it snaps back into bipolar conduction.

In operation, during an ESD event, the voltage will quickly go from 0 volts to a high voltage (e.g., 1 or higher volts) for a certain duration. This will effectively "short" the capacitor 14 resulting in the body voltage rising to the voltage of the I/O pad. This, in turn, will reduce the snap back voltage which is beneficial to the ESD performance of the ESD protection device 50a.

However, after the anti e-fuse 16a is blown, the I/O pad connection is cutoff from the RC triggering network, resulting in the body voltage remaining at a low voltage, i.e., 0 volts. In one example, the anti e-fuse 16a may be blown with a low voltage of approximately 40 mV. As the voltage input to the ESD protection device 50a will now always be low, the body of the ESD protection device 50a will no longer fluctuate but will remain at ground, which is advantageous for normal circuit operation. For this case the adjustment of the FET body resistance is "turned off" but the FET will still function like a FET. Thus, the anti e-fuse is configured to render the ESD protection device insensitive to a potentially triggering signal after blowing the e-fuse of the circuit.

Figure 7:
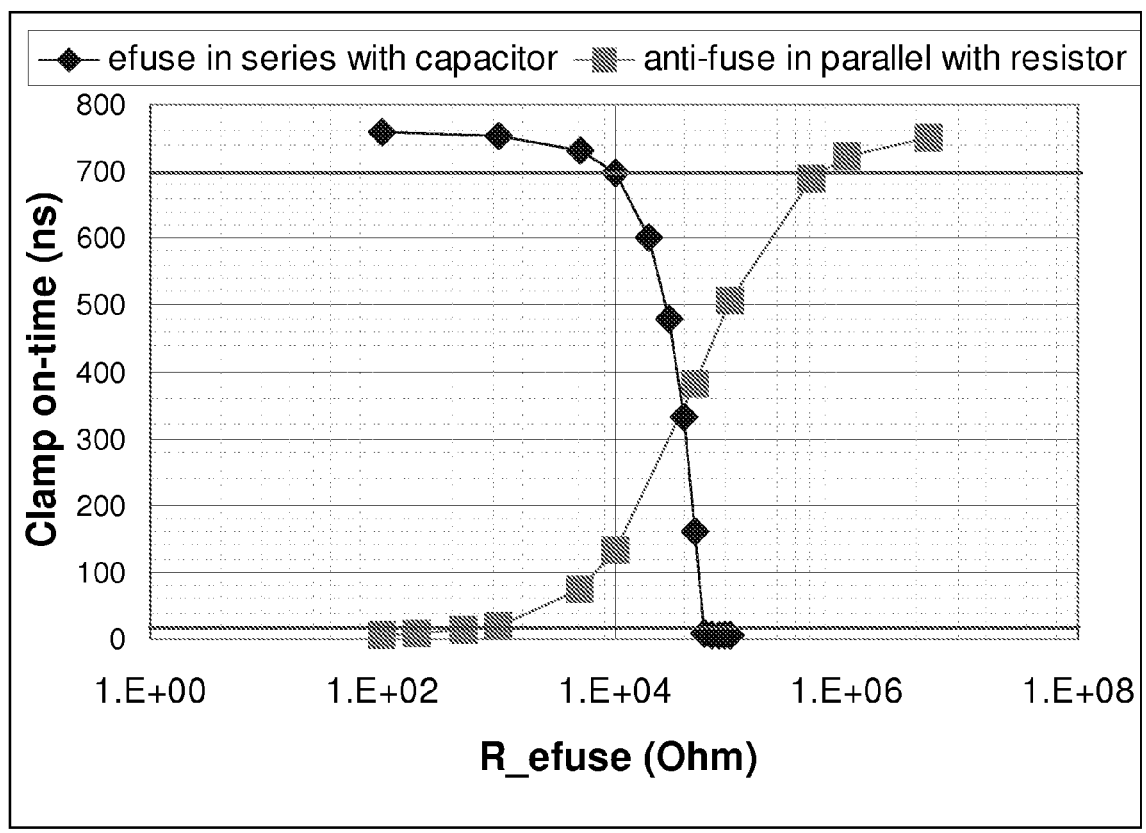
FIG. 7 shows a graph of simulation results showing the first aspect of the invention and the second aspect of the invention.

FIG. 7 shows a graph of simulation results showing the first aspect of the invention and the second aspect of the invention. In the example of FIG. 7, the RC triggering Power Clamp with triggering network has an R=50 kΩ and C=20 pF. In the simulation shown, the circuit using the e-fuse will give the desired results as long as its resistance is set at less than 10 kΩ prior to being blown and is greater than 60 kΩ after being blown for the first aspect of the invention (FIG. 2). The anti e-fuse resistance of the second aspect of the invention (FIG. 3) will give the desired results as long as it is greater than 500 kΩ before being blown and is less than 1 kΩ after being blown. In one embodiment, the e-fuses are made of polysilicon which can provide the resistance shift indicated by the simulations. As shown in the simulation graph of FIG. 7, a clamp on time is approximately 700 ns prior to being blown. This time duration is sufficient to ensure that the ESD event has been effectively discharged.

As should now be understood by those of ordinary skill in the art, the invention solves many issues with current technologies. For example, the RC triggering network can tolerate the additional resistance of the e-fuse (as it is not placed directly in the ESD protection path, where the amount of resistance added cannot be tolerated). Also, the e-fuse can disconnect the RC triggering network so that it will no longer trigger the ESD protection device, which was not possible in conventional systems.

It is further noted that, unless indicated otherwise, all control functions described herein may be performed in either hardware or software, or some combination thereof. In a preferred embodiment, however, the control functions are performed by a processor, such as a computer or an electronic data processor, in accordance with code, such as computer program code, software, and/or integrated circuits that are coded to perform such functions, unless indicated otherwise.

The structures as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those of skill in the art will recognize that the invention can be practiced with modifications and in the spirit and scope of the appended claims.

What is claimed is:

1. A circuit comprising:
   a triggering network electrically coupled in series to at least one inverter and an electrostatic discharge (ESD) protection device;
   an e-fuse electrically coupled with the triggering network and configured to render the ESD protection device insensitive to a triggering signal after blowing the e-fuse; and
   an e-fuse blow signal configured to blow the e-fuse resulting in an output of a last inverter which renders the ESD protection device in an off state.

2. The circuit of claim 1, wherein the triggering network is electrically coupled in series with an odd number of inverters and the ESD protection device.

3. The circuit of claim 2, further comprising the e-fuse blow signal configured to blow the e-fuse resulting in the output of the last inverter of the odd number of inverters being low which renders the ESD protection device in an off state.

4. The circuit of claim 2, wherein the triggering network includes, from Vdd to ground, a resistor electrically coupled in series with a capacitor and the e-fuse.

5. The circuit of claim 1, wherein the triggering network is electrically coupled in series with an even number of inverters.

6. The circuit of claim 5, wherein:
the triggering network includes, from Vdd to ground, a capacitor electrically coupled to a resistor in series; and
the e-fuse is an anti e-fuse which is electrically coupled to the resistor in parallel.

7. The circuit of claim 6, wherein the anti e-fuse is a FET with engineered snapback voltage that shorts during fuse blow.

8. The circuit of claim 6, wherein an output of a last inverter of the even number of inverters is low when the anti e-fuse is blown thereby rendering the ESD protection device in an off state.

9. The circuit of claim 1, wherein the triggering network is electrically coupled in series with at least three inverters and the e-fuse is electrically coupled to an even numbered one of the at least three inverters, leading to ground and an output of a last inverter of the even number of inverters is low when the anti e-fuse is blown thereby rendering the ESD protection device in an off state.

10. The circuit of claim 1, wherein:
the triggering network includes, from an I/O pad to ground, the e-fuse electrically coupled in series with a resistor and a capacitor;
the triggering network is in an electrical path with the I/O pad and provides an input to the ESD protection device which also serves as an output driver for the I/O pad; and
after the e-fuse is blown, an I/O pad connection is cutoff from the triggering network, resulting in a body voltage remaining at a low voltage and as a result a voltage input to the ESD protection device will be low and a body of the ESD protection device will no longer fluctuate but will remain at ground.

11. The circuit of claim 1, wherein:the triggering network includes, from an I/O pad to ground, a capacitor electrically coupled in series with a resistor;
the e-fuse is an anti e-fuse electrically coupled to the resistor in parallel; and
the triggering network is in an electrical path with the I/O pad and provides an input to the ESD protection device which also serves as an output driver for the I/O pad; and
after the anti e-fuse is blown, an I/O pad connection is cutoff from the triggering network, resulting in a body voltage remaining at a low voltage and as a result a voltage input to the ESD protection device will be low and a body of the ESD protection device will no longer fluctuate but will remain at ground.

12. A circuit comprising:
a triggering network electrically coupled to an electrostatic discharge (ESD) protection device; and
an e-fuse electrically coupled with the triggering network and configured to render the ESD protection device insensitive to a triggering signal after blowing the e-fuse, wherein:
the triggering network is electrically coupled in series with an odd number of inverters and the ESD protection device;
the triggering network includes, from Vdd to ground, a resistor electrically coupled in series with a capacitor and the e-fuse;
a relative magnitude of resistance of the e-fuse is smaller than a resistance of the resistor in a pre-blown state; and
a relative magnitude of resistance of the e-fuse is greater than the resistance of the resistor in a post-blown state.

13. A method of rendering an electrostatic discharge (ESD) protection device being insensitive to a triggering signal, the method comprising:
setting up a triggering network electrically coupled in series with at least one inverter and the ESD protection device;
configuring an e-fuse electrically coupled with the triggering network to render the ESD protection device insensitive to the triggering device after blowing the e-fuse; and
blowing the e-fuse with an e-fuse signal resulting in an output of a last inverter which renders the ESD protection device in an off state after installation of a device.

14. The method of claim 13, wherein the blowing the e-fuse renders an input voltage to the ESD protection device to always remain low thereby rendering the ESD protection device in a permanently off state.

15. A circuit comprising:
a triggering network including a resistor, a capacitor, at least one inverter and an electrostatic discharge (ESD) protection device that are electrically coupled in series; and
an e-fuse electrically coupled with the triggering network and configured to render the ESD protection device insensitive to a triggering signal after blowing the e-fuse, wherein
a relative magnitude of resistance of the e-fuse is lesser or greater than a resistance of the resistor in a pre-blown state; and
a relative magnitude of resistance of the e-fuse is opposite of that from the pre-blown state in a post-blown state.

\* \* \* \* \*